(12) United States Patent
Ives

(10) Patent No.: US 10,491,174 B1
(45) Date of Patent: Nov. 26, 2019

(54) MULTI-BEAM POWER GRID TUBE FOR HIGH POWER AND HIGH FREQUENCY OPERATION

(71) Applicant: Calabazas Creek Research, Inc., San Mateo, CA (US)

(72) Inventor: R. Lawrence Ives, San Mateo, CA (US)

(73) Assignee: Calabazas Creek Research, Inc., San Mateo, CA (US)

(*) Notice: Subject to any disclaimer, the term of this patent is extended or adjusted under 35 U.S.C. 154(b) by 0 days.

(21) Appl. No.: 15/496,142

(22) Filed: Apr. 25, 2017

(51) Int. Cl.
*H03F 3/189* (2006.01)
*H01J 19/38* (2006.01)
*H01J 19/062* (2006.01)

(52) U.S. Cl.
CPC .......... *H03F 3/189* (2013.01); *H01J 19/062* (2013.01); *H01J 19/38* (2013.01); *H03F 2200/451* (2013.01)

(58) Field of Classification Search
CPC ......... H01J 19/38; H01J 19/062; H03F 3/189; H03F 2200/451
See application file for complete search history.

(56) References Cited

U.S. PATENT DOCUMENTS

| | | | | |
|---|---|---|---|---|
| 3,934,168 A * | 1/1976 | Hardman | ............... | H01J 19/38 313/293 |
| 4,158,791 A * | 6/1979 | Lien | ............... | H01J 23/30 315/3.5 |
| 4,263,528 A * | 4/1981 | Miram | ............... | H01J 23/05 313/107 |
| 4,527,091 A * | 7/1985 | Preist | ............... | H01J 23/065 313/293 |
| 4,611,149 A * | 9/1986 | Nelson | ............... | H01J 25/12 313/293 |
| 4,748,369 A * | 5/1988 | Phillips | ............... | H01J 23/065 313/237 |
| 4,779,022 A * | 10/1988 | Badenhoop | ............ | H01J 19/38 313/296 |
| 4,994,709 A * | 2/1991 | Green | ............... | H01J 3/027 216/12 |
| 5,227,701 A * | 7/1993 | McIntyre | ............... | H01J 25/36 315/39.3 |
| 5,355,093 A * | 10/1994 | Treado | ............... | H03F 3/56 315/39.57 |
| 5,604,401 A * | 2/1997 | Makishima | ............ | H01J 23/06 313/309 |
| 6,133,786 A * | 10/2000 | Symons | ............... | H01J 23/54 313/293 |
| 6,285,254 B1 * | 9/2001 | Chen | ............... | H03F 3/58 330/129 |
| 9,196,449 B1 * | 11/2015 | Chang | ............... | H01J 31/04 |
| 2004/0011506 A1 * | 1/2004 | Langlois | ............... | H01J 23/005 165/80.2 |

(Continued)

*Primary Examiner* — Kevin Quarterman
(74) *Attorney, Agent, or Firm* — File-EE-Patents.com; Jay A. Chesavage

(57) ABSTRACT

A multi-beam triode for RF amplification has plurality of electron beams generated by a thermionic cathode, each electron beam travelling through an associated grid and to a common anode electrode. An input RF energy is coupled to a grid support which is electrically common to a control grid of each electron beam, and RF is coupled out of the grid—anode gap, with suitable input RF matching cavities and output RF matching cavities provided.

20 Claims, 5 Drawing Sheets

(56) References Cited

U.S. PATENT DOCUMENTS

2004/0169554 A1* 9/2004 Langlois .............. H01J 23/033
                                                                                                            330/44

2008/0042073 A1* 2/2008 Kirshner .............. H01J 25/78
                                                                                                             250/396 R

* cited by examiner

Prior Art Triode

Prior Art Triode Amplifier

Multi-Beam Gridded Triode

Multiple Beam Cathodes and Grids

Multi-Beam Gridded Triode

Multi-Beam Triode with Input and Output Couplers

Grid Support with Control Grids

Section A–A

- 304 Anode
- 802 Electron Trajectory
- 309 Cathode Pedestal
- 316 Grids
- 315 Grid Support
- 308 Cathode Section A–A Thermal Shields Grid

MULTI-BEAM POWER GRID TUBE FOR HIGH POWER AND HIGH FREQUENCY OPERATION

FIELD OF THE INVENTION

The present invention relates to an electron beam triode device. In particular, the present invention relates to a multi-beam triode, tetrode or pentode for high frequency and high power operation.

BACKGROUND OF THE INVENTION

Prior art high power triodes/tetrodes are typically limited to frequencies below 300 MHz and power levels less than 50 kW. The maximum useful frequency for amplification is limited by control grid capacitance and the physical limitation of small control grid to cathode and control grid to anode spacing required for high average power operation. The maximum output power of prior art triode/pentode devices is limited by available beam power and thermal dissipation on the control grids and anode plate.

Amplification at high power or high frequency beyond the capability of gridded triodes is typically accomplished using Klystrons or Inductive Output Tube (IOT) devices. At frequencies below 800 GHz, however, klystrons are extremely large and require magnetic focusing. IOTs, which are also magnetically focused, may have multiple electron beams, each electron beam formed from a concave thermionic cathode operating at significantly elevated temperature than a gridded triode, and requiring a graphite control grid because of the elevated operating temperature. However, it is difficult to design the magnetic field structures for such IOT devices because of the complex interactions between the solenoidal magnetic field generator and the off-axis electron beams, and the expense and fragility of fabricating graphite control grids. Multi-beam IOTs (which are only recently commercially available) are expensive, large, and difficult to fabricate, and single beam IOTs are not practical for power levels above 100 kW.

It is desired to provide a gridded triode and tetrode which do not require the magnetic field of klystrons and IOT devices, and are smaller in size than the klystron or IOT, the triode and tetrode device utilizing planar cathodes, and providing higher frequency operation and higher power operation than prior art gridded triode/pentode devices.

OBJECTS OF THE INVENTION

A first object of the invention is a multi-beam triode having a coaxial input cavity for coupling an RF input, the coaxial input coupled to a multi-beam grid support, the multi-beam grid support including a plurality of grid apertures, each of which is electrically coupled to an associated control grid, each control grid regulating the electron flow of an associated electron beam, each electron beam formed between a thermionic cathode and an anode on opposite sides of each associated control grid, the control grid support and control grids coupled to an input source, and the anode coupled to an output cavity for coupling the amplified RF out of the device.

A second object of the invention is a multi-beam triode/tetrode having an RF input and an RF output, the multi-beam triode having a plurality of electron beams, each electron beam passing from a thermionic cathode through a control grid, an optional screen grid, thereafter to an anode, the RF input coupled to a control grid support electrically coupled to the plurality of control grids, the anode coupling amplified RF to the coaxial RF output.

A third object of the invention is an amplifier comprising a multi-grid triode coupled to an output RF cavity having a coaxial outer RF cavity which shares a common cavity wall with an input RF cavity, the output RF cavity coupled to an anode of the triode, the input RF cavity coupled to a control grid of the triode, and the grid of the triode coupled to the common cavity wall, the triode having a cathode with individually raised pedestals, each pedestal having a work function material such as an oxide applied, the cathode being adjacent to a control grid support having a plurality of apertures, one aperture for each raised pedestal region of the cathode, each aperture of the control grid support having a control grid, and an anode positioned on an opposite surface of the control grid support from the cathode.

SUMMARY OF THE INVENTION

A multi-beam triode has an RF input coupled to a control grid support which is positioned between a thermionic cathode and an anode. One or more optional screen grids may also be positioned between the control grid and the anode, each control grid preferably having an electrical potential less than an anode electrical potential. A device having an anode and a single screen grid positioned between the control grid and cathode is a four element device known as a tetrode, and a five element device having an anode and two screen grids positioned between the control grid and cathode is known as a pentode. For each of these embodiments of the invention (as a triode, tetrode, or pentode), a plurality of electron beams forms between each thermionic cathode and a common anode, each electron beam controlled by a control grid which has a mesh aperture for the passage of electrons, each control grid electrically coupled to the control grid support. The grid structure supports, and is electrically coupled to, the control grids, where the control grids and cathode form a gap which is coupled to the input RF field which may be applied from a resonant coaxial waveguide or cavity, and in one embodiment, the RF output is coupled from the gap between the anode and control grid, the RF output thereafter conveyed through a tuned cavity such as a coaxial cavity having an RF output port.

DETAILED DESCRIPTION OF THE INVENTION

Figure 1:
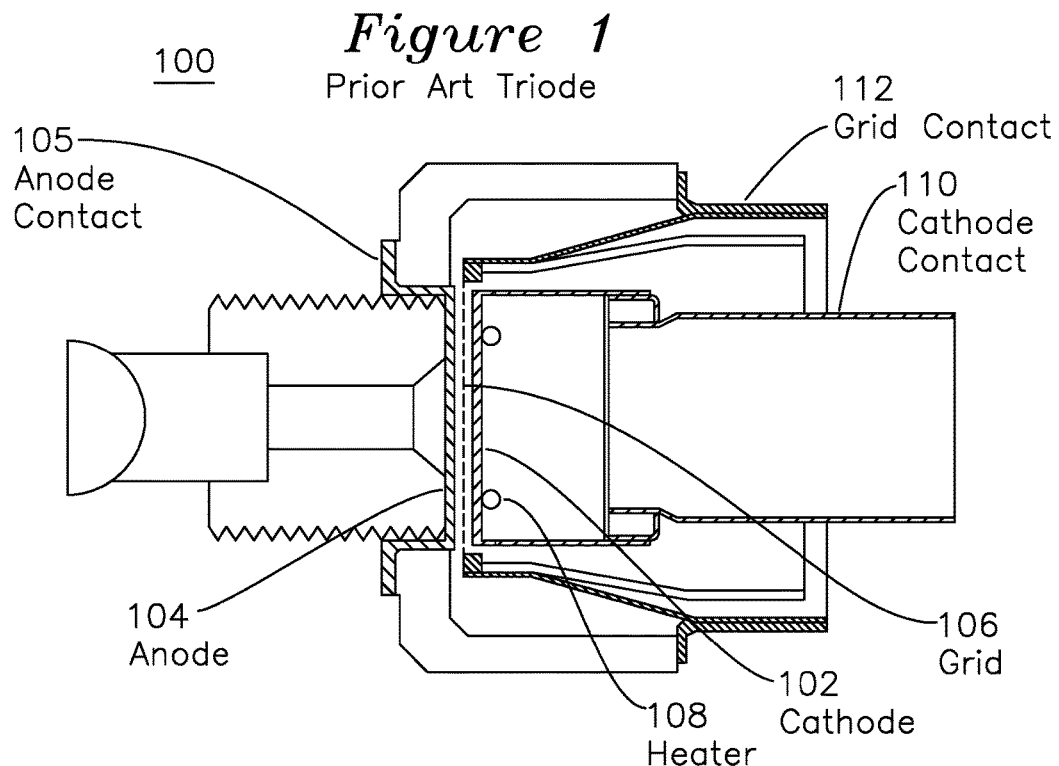
FIG. 1 shows a cross section view of a prior art planar triode.

In the prior art triode, a single control grid is used. Because of the close proximity to the cathode (often on the order of 0.010 inch), the grid is thermally coupled to the cathode, which provides radiant heat to the grid. A second constraint of a prior art single grid triode is the requirement that the grid maintain its planarity of spacing from the cathode to within a tolerance on the order of 0.001 inch. Because removal of heat from the grid is necessary to maintain the temperature of the grid to below 500° C. to avoid thermally-induced grid deformation, a prior art grid is limited in size to a thermal dissipation limit, which accordingly limits the power capability of the prior art planar triode device.

The use of the term "triode" in the present invention is understood to also refer to devices with one or more screen grids, such as tetrodes and pentodes, as previously introduced. The triode/tetrode/pentode power grid tube of the present invention overcomes the prior art limitations to generate high power and high frequency through the use of multiple electron beams, each electron beam passing through a control grid, and each control grid adjacent to an elevated boss region of a corresponding cathode emitter. Each grid of the present invention may be on the order of the diameter (or longest dimension) of a prior art triode grid which is limited in size by the thermal dissipation of the prior art grid (where thermal energy is removed at the edge of the control grid), however the large number of individual grids of the present invention provides a corresponding multiple in the available output power of the multi-grid triode over a prior art triode having a single central control grid structure. The multiple electron beams and associated control grids of the present invention distribute power densities over significantly larger surface area of the control grid while maintaining compact structures for the grid supports to provide high tolerance spacing between control grid and anode, and also between control grid and cathode. Compared to prior art devices such as the IOT or klystron requiring a confining magnetic field, concave cathode faces, and an associated high temperature cathode operating temperature requiring graphite grids (for gridded devices such as the IOT), the thermal dissipation in the control grid of the present invention occurs over larger surface areas and multiple grids with relatively low power densities, facilitating greater removal of heat developed during operation and providing greater output power. Additionally, the cathode emitters of the present invention operate without an external magnetic field generator, and so the cathode and grid structures are flat, and operate at temperatures in the range of 800° C. or less, which reduces cathode oxide evaporation and thermal stress coupled to the control grids from the cathode radiant heating. The present invention may operate with a single control grid support (as a triode device) with a grid to cathode separation on the order of 0.05 inch, or with a single control grid support and also a screen grid support (known as a tetrode) to isolate the control grid from out-of-phase voltage fluctuations at the anode electrode, which would otherwise generate out-of-phase displacement currents back to the control grid and impair high frequency operation, an undesirable output to input capacitive coupling known in the art as the Miller effect. The optional one or more screen grids would be of similar construction as the control grid, positioned between the control grid and anode, and electrically isolated from the control grid or anode with each screen grid having its own electrical connection to a voltage potential delivered from an outside source. The control grids and optional one or more screen grids are perpendicular to the central axis (301 of FIG. 3), with a separation distance from screen grid to control grid or screen grid to screen grid on the same order of magnitude as the separation distance from the control grid to the cathode. The separation from a control grid to anode, or alternatively, from screen grid to anode, is on the order of 0.15 inch.

In one example of the invention, a power gridded tetrode generates more than 1 MW of output power at lower frequencies (110 MHz) and a few hundred kilowatts at frequencies up to 500 MHz. Other examples of the invention provide high output RF power exceeding 200 kW CW at frequencies exceeding 320 MHz and 100 kW CW at 650 MHz.

FIG. 1 shows a section view of the elements of a prior art planar triode 100. Heater 108 enables the cathode 102 to provide thermionic electron flow. A voltage potential is applied between the cathode 102 and anode plate 104 which drives an electron flow controlled by an appropriate voltage applied to the control grid 106. Because of the small grid to cathode displacement distance, the current between the cathode 102 and anode 104 is controlled by a relatively small voltage difference between control grid 106 and cathode 102. The planar triode 100 includes external grid contact 112 coupled to control grid 106, base contact 110 coupled to cathode 102, and anode contact 105 coupled to anode 104. High power devices include water jackets (not shown), which are typically thermally coupled to the anode, which is typically grounded.

Figure 2:
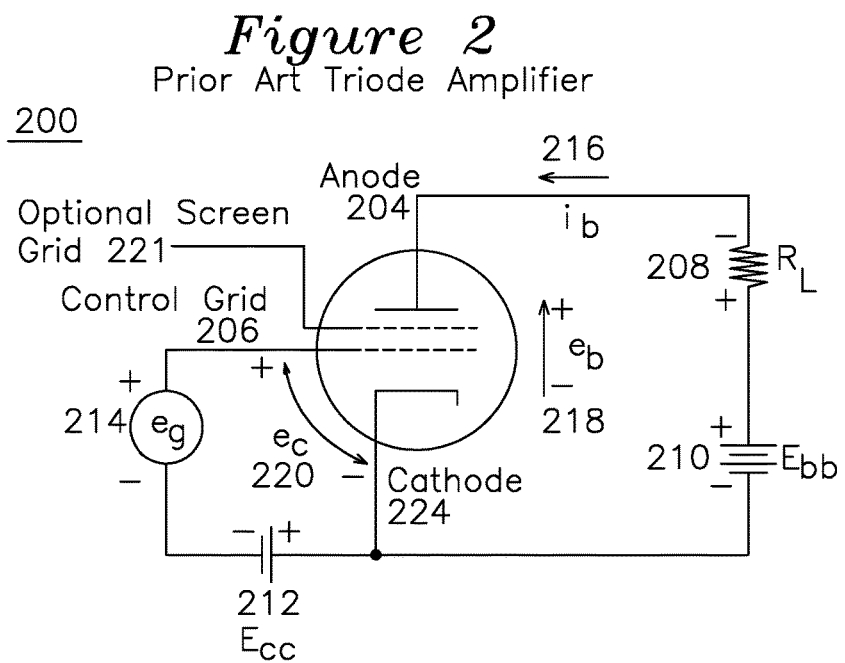
FIG. 2 shows an electrical circuit diagram of a prior art triode amplifier.

FIG. 2 shows the basic circuit diagram for a triode amplifier 200. The major components are a generator providing an input RF signal $e_g$, a grid bias voltage source 212 providing voltage $E_{cc}$, an anode (high voltage) source 210 providing voltage $E_{bb}$, and a load resistor 208 providing impedance $R_L$. Because of the load resistor 208 $R_L$, the potential voltage $e_b$ 218 between the anode 204 and the cathode 224 depends on the magnitude of the high voltage source $E_{bb}$ 210 and the magnitude of the anode (beam) current $i_b$ 216. The magnitude of current $i_b$ 216 is controlled by the potential between control grid 206 and cathode 224 voltage $e_c$. The voltage amplification or gain K is defined as $$K = \frac{\Delta eb}{\Delta ec} = \frac{\Delta ib}{\Delta ec} R_L$$

The advantage of a triode is that a large output power can be generated with a small amount of input power because the control grid current is typically negligibly small.

The high frequency performance of a triode is limited, in part, by the capacitance between control grid and anode, and the phase reversal of output voltage 218 to input voltage $e_c$ 220. This results in a gain dependent increase in the effective input capacitance at the control grid 206 known as the Miller effect. The Miller effect can be reduced by inserting a coarse mesh, referred to as a screen grid 221, between the control grid 206 and anode 204. The optional screen grid 221 shields the control grid 206 from capacitance and displacement currents between the control grid 206 and anode 204. A device with control grid 206 and screen grid 221 is referred to as a tetrode.

For high power gridded tubes with significant beam current, the shielding can partially be achieved by space charge in the electron beam. Consequently, both triodes (with one common control grid) and tetrodes (with a common control grid plus a fixed potential screen grid positioned between control grid and anode electrode) may be used in the present invention.

Prior art gridded triode/tetrode devices have limited power and frequency. The prior art IOT, originally invented by Merly Shrader and Don Preist and known as the klystrode in the 1980s, later became known as the IOT. IOTs use a converging, cylindrical electron beam requiring magnetic focusing. This requires a spherical cathode and control grid and the associated solenoid and iron focusing structures. By contrast, triodes and tetrodes use planar cathodes and grids with no magnetic focusing. IOTs typically use dispenser cathodes operating at approximately 1000° C. Because of beam interception and control grid heating by the cathode, high power IOTs use pyrolytic graphite grids, which are expensive, difficult to fabricate, and exhibit low manufacturing yields. Triodes and tetrodes of the present invention use oxide cathodes operating at approximately 800° C. and control grids easily fabricated from tungsten or molybdenum. Oxide cathodes of the present invention are also significantly less expensive than dispenser cathodes used in klystrons and IOTs.

Another major advantage of the present invention is that multiple beam triodes/tetrodes are not restricted to cylindrical beams as used in multi-beam IOTs (as well as multiple beam klystrons). A designer can select the beam/grid configuration to maximize current generation and heat removal from the control grid with the electron beam having an arbitrary non-circular shape. This allows significantly higher currents at the same voltage than can be achieved from a multi-beam IOT. The overall diameter of the cathode assembly of the multi-beam triode/tetrode is reduced, so the coaxial drive input is similar to prior art single beam triodes and tetrodes. Additionally, the coaxial RF input and RF output structures used in prior art devices may be largely preserved with the present invention, with the added provision for cooling of the grids, since the device is operating at higher power levels provided by the present invention over prior art triodes.

Figure 3:
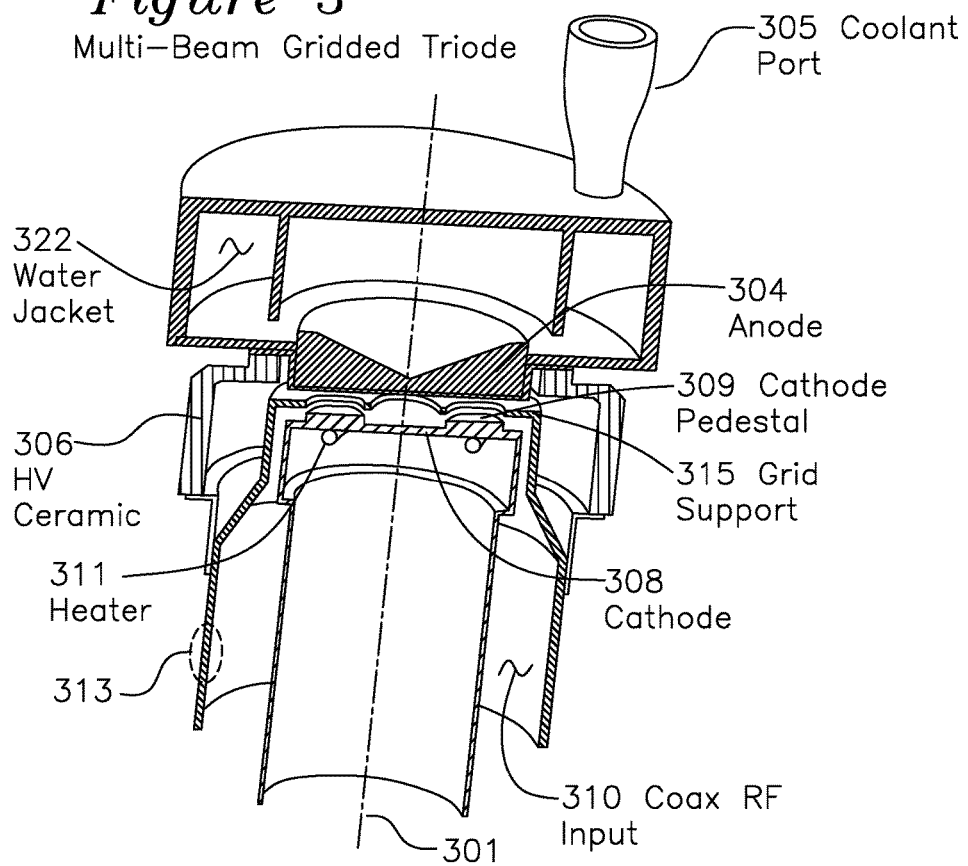
FIG. 3 shows a cross section view of a multi-beam gridded triode of the present invention.

FIG. 3 shows a section view of a multiple beam gridded triode. The input RF cavity 310 and anode water jacket cooling 322 are similar to the prior art single beam triode shown in FIG. 1, but the present examples of the invention contain a grid support 315 which is electrically coupled to eight, roughly triangular-shaped grids (shown as 316 in FIG. 4) fixed to the grid support 315. It is understood that any number or arrangement of grids and associated elevated cathode boss pedestals may be used without limitation. Each of the eight cathode emitters 309 of the example shown can be formed as raised pedestal bosses machined on a single nickel substrate with an oxide coating (such as BaO) applied to the raised pedestal boss to enhance electron emission in the pattern coated area, with the raised pedestals and control grids aligned in axial projection to each other about the central axis 301 of the device. A single heater 311 is coupled to the eight emitters of the common cathode structure. In one example process for forming a thermionic cathode, a barium oxide paste is selectively applied to the raised pedestal boss areas of the cathode or for the case of a planar cathode, selected areas are patterned with barium oxide paste, after which a vacuum is drawn, such as during bake-out of the device, and the device is thereafter heated to 500° C. in a vacuum, which reduces the barium oxide paste to barium on the applied areas, thereby creating selective regions of enhanced electron emission on the surface of the cathode. Any number of electron beams, grids, and cathode boss pedestals may be used. In one example of the invention, the number of electron beams, grids, and cathode boss pedestals is in the range from 3 to 15.

Figure 4:
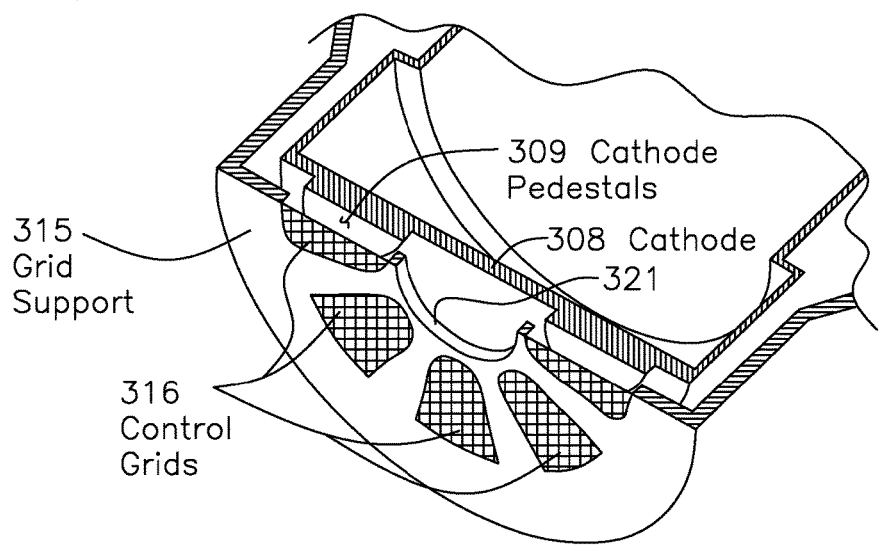
FIG. 4 shows a cross section view of the grids and cathode emitter pedestals of an embodiment of the present invention with respect to FIG. 3.

FIG. 4 shows a section detail view of the spatial relationship between the grid support 315 and cathode 308. The electron beam shape is determined by the control grid configuration, and the control grid support 315, which optimizes heat transfer from the individual control grids 316 to the grid support 315, and to the outer edge of the grid support where heat can be removed, such as by thermal conduction to a water jacket. The use of modified control grids allows a larger beam cross section than could be achieved with circular control grids, significantly increasing beam current and output power while maintaining modest control grid temperatures, and the gaps between control grids can be tailored for more uniform temperature in the presence of radial thermal flux as heat is removed from each control grid. Such a configuration cannot be achieved with multi-beam IOTs or klystrons, where round, converging beams are required.

A critical issue is capacitance between the control grid 315 and cathode 308, which must be minimized in order to increase the operating frequency of the triode/tetrode/pentode. In one embodiment of the invention, the control grid 316 to cathode 308 capacitance is reduced by selectively elevating the individual electron emitting regions (adjacent to matching control grids above) on the cathode substrate. If the elevated pedestals (or bosses) 309 of the emitting regions 309 of the cathode 308 are sufficiently elevated above the surrounding cathode, it may also be desirable to thermally insulate the grid support 315 from radiant heat from the cathode 308, which may be accomplished with a series of thin molybdenum sheets placed surrounding, and below the level of the cathode pedestals 309 (to reduce capacitance to the grid support 315), where the molybdenum sheets reduce radiant heat gain from the cathode to the grid support 315.

Figure 5:
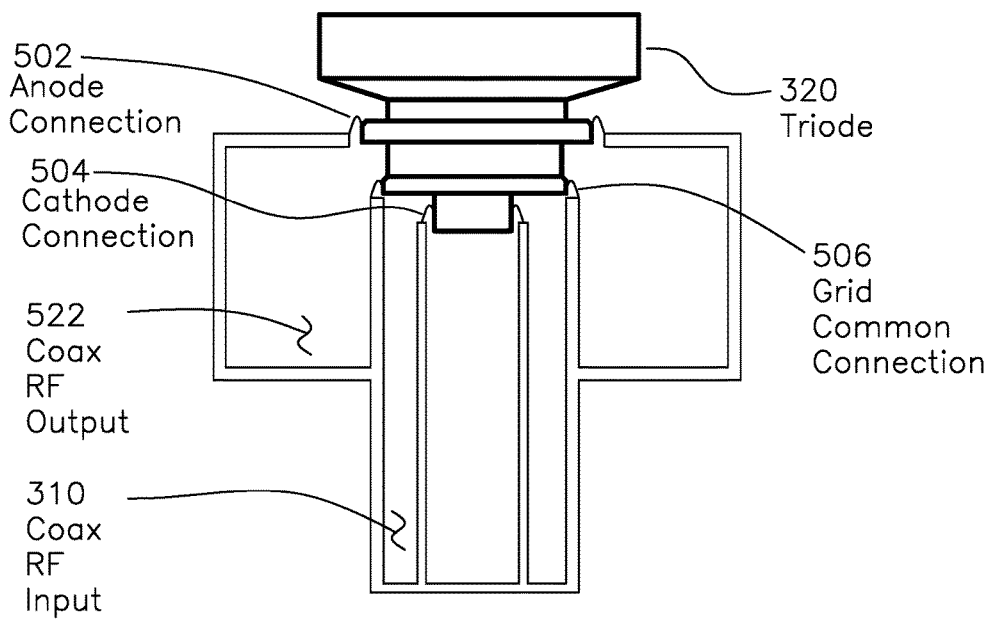
FIG. 5 shows an overall view of a triode amplifier assembly with a coaxial RF input cavity, and a coaxial RF output cavity.

The triode shown in FIG. 3 would generate an electron beam modulated at the desired operating frequency and driving a surrounding cavity resonant at the operating frequency, such as a coaxial cavity. In practice, the triode/tetrode of the present invention can drive cavities tuned to any frequency compatible with the triode's electrical parameters (capacitances, inductances, etc.). FIG. 5 shows a conceptual example of an RF source 500 including a triode 320 which is operable with a prior art tuned coaxial input RF cavity 310 and tuned coaxial output cavity 522 (input and output couplings not shown). The triode provides the pulsed or modulated electron beam, and the coaxial cavity and input RF drive determine the operating frequency.

Figure 6:
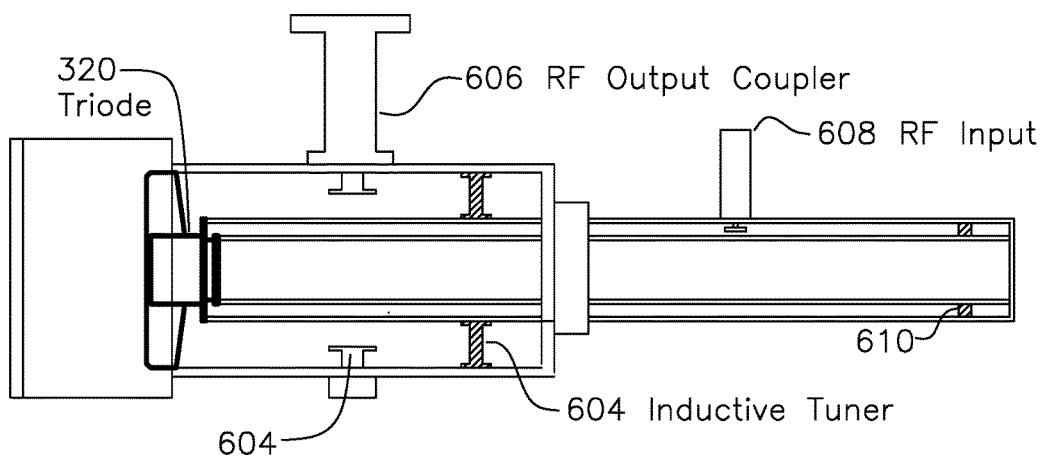
FIG. 6 shows tuning structures for a coaxial input RF cavity and coaxial output RF cavity with an RF input coupler and RF output coupler.

FIG. 6 shows an example amplifier embodiment of the invention designed to produce RF power from 300 MHz to 425 MHz. Triode device 320 is inserted as shown, with the RF input 608 coaxially coupled to the triode 320 control grid, and RF output 606 coupled to the triode 320 output cavity via triode 320 anode. The same triode 320 can drive other cavities operating at different frequencies, or the same cavity in a harmonic mode for 2× or 3× frequency operation. The input RF cavity fed by input RF 608 may include tuning capability, and includes inductive tuning structures 604 for output and 610 for input, which operate to change the electrical resonant frequency of the output RF cavity to match the operating frequency, as is known in the art of resonant cavity tuning and coupling.

Among other applications, the power grid tubes of the present invention can provide high RF power at frequencies of interest for particle accelerators. In one example of the invention, a multi-beam gridded triode/tetrode/pentode device can provide 325 MHz at 200 kW CW, and 650 MHz at 100 kW CW RF power with at least 75% efficiency. In another example of the invention, a single triode or tetrode can drive cavities resonant at both the fundamental and second harmonic frequency of the cavity, providing dual frequency operation.

A typical prior art triode can operate at more than 15 kV; although 8-10 kV is more common. For 10 kV operation, 27 Amps would be required to obtain the required 270 kW of beam power for 200 kW RF output power. Prior art triode cathodes can operate up to 10 A/cm$^2$ of peak current emission density. Since the cathode is only emitting for a fraction of the RF cycle, the average current density is approximately 2.5 A/cm$^2$. Therefore, the cathode surface area required is approximately 10.8 cm$^2$. The area of a prior art triode cathode is approximately 3 cm$^2$, so equivalent surface area for slightly more than three such prior art triodes would be sufficient. This provides flexibility to reduce beam voltage and increase cathode surface area to achieve the required beam current. An exemplar eight-beam triode configuration such as was shown in FIG. 3 could provide approximately 16 cm$^2$ of surface area. This allows a reduction in beam voltage to 7 kV and still provides sufficient beam power to produce 200 kW of output power at 75% efficiency. A 200 kW output power would not be possible from a prior art grid triode because a triode control grid area of 3 cm$^2$ would have unsustainably high current density, and a single control grid with an area of 16 cm$^2$ would cause excessive heat buildup at the center of the grid from radiant heat delivered by the adjacent cathode with a separation distance on the order of 0.010 inch, as well as the heat load from kinetic electron collisions.

Oxide cathodes of the present invention provide significantly more flexibility for beam shaping than dispenser cathodes typically used in klystrons (and IOTs). Oxide cathodes are formed by applying a coating of barium oxide on a nickel surface heated with an integral heater. Other oxide coatings include oxides of at least one of: beryllium (Be), magnesium (Mg), calcium (Ca), strontium (Sr), barium (Ba), or radium (Ra). Through patterned application of oxide, electron emission occurs only where the oxide coating is applied, such as to the elevated pedestals 309 of the cathode 308. Using elevated pedestals treated with oxide for enhanced electron production forms electron beams only where required, and the pedestals place the emitting regions close to the control grids 316 as required, the non-pedestal regions thereby lowering the capacitance between control grid and cathode in non-emitting regions. Additionally, non-emitting regions of the cathode 308 such as the cathode center 321 may have corresponding grid support 315 aperture 321 to further lower control grid support 315 to cathode 308 capacitance. Alternatively, for lower frequency devices, the cathode may be planar and without elevated bosses, with the electron beam shape formed by applying the oxide in desired shapes and patterns which match the subsequently placed adjacent control grid shape and pattern of the grid support 315 apertures. Consequently, one can create arbitrarily shaped electron beams by applying the appropriate oxide pattern on the nickel substrate using a patterned mask or other method for excluding the deposition of oxide on non-active regions of the cathode.

The control grids 316 are electrically coupled by grid support 315 to generate the pulsed beams propagating across the gap to the anode. Control grids 316 may be fabricated from tungsten mesh screen, which is commonly available in sheet form. In one example of the invention, the control grids are formed from woven tungsten wire mesh where the wire diameter is on the order of 0.001 inch, with transparency (ratio of barrier-free area to total area) on the order of 80%. Consequently, the cost for control grids of the present invention is extremely low, compared to the significantly higher cost for spherical grids for IOTs, klystrons, and traveling wave tubes. In an example of the invention, the transparency of the control grids is in the range of 8% to 100%.

Figure 7:
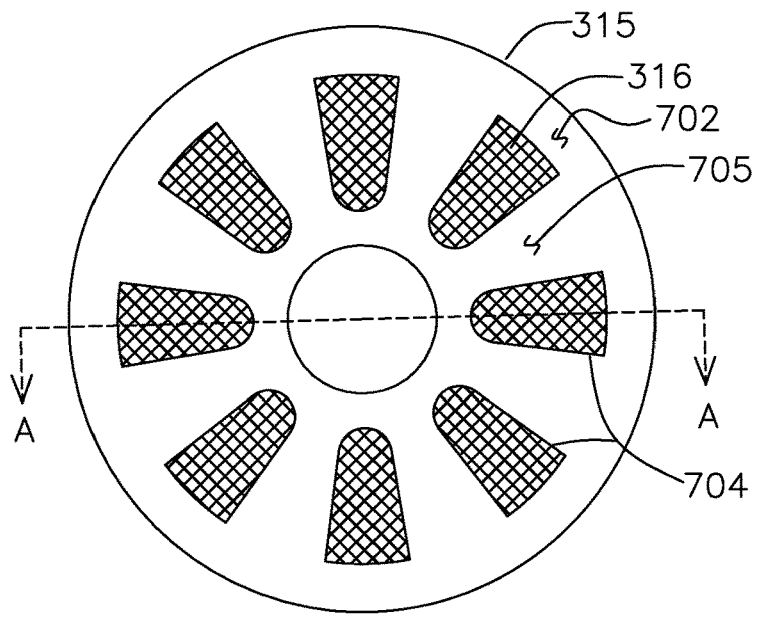
FIG. 7 shows a multi-beam grid support for the triode of FIG. 3.
Figure 9:
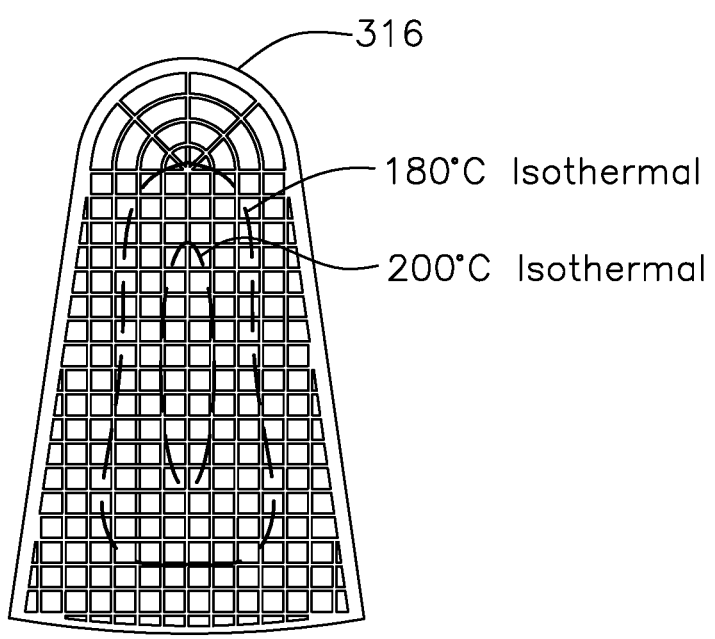
FIG. 9 shows an example control grid and associated temperature profile.

The primary consideration for control grid design is maintaining sufficiently low temperature during operation to ensure there is no thermally induced warping or distortion out of plane of the original placement. With single cylindrical beams of an IOT, this constraint limits the diameter of the control grid. By contrast, for a multiple beam gridded triode/pentode of the current invention, the beam shape can be arbitrarily chosen for maximum heat transfer from the control grid to the grid support. In one embodiment of the invention, the grid support for a multiple beam device could be oval or rounded-vertices triangle apertures arranged circumferentially about a center axis such as FIG. 4 shows, with each control grid 316 electrically common to each other and to the grid support 315. In operation, the inner regions of the control grids will become significantly hotter than the outer edges due to the increased thermal conduction length, as shown in FIG. 9. Preferably, the control grid should be shaped to reduce power dissipation near the center of the device with increased dissipation available near the outer edges. In one example of the invention, the central grid temperature is less than 200° C. as shown, in another example of the invention, the central grid is less than 300° C., and in another example, the central grid is less than 500° C. An example grid support 315 is shown in FIG. 7 with individual apertures 704 surrounded by thermally conductive regions 705 and an outer annular ring 702, which may provide uniform control grid heating compared to a single control grid aperture. For improved removal of the heat developed in grid support 315, the common coaxial wall 313 of FIG. 3 may be of increased thickness and coupled to a heat sink, or in another example of the invention, may include a water jacket provision such as using a double wall structure for fluid circulation and heat removal (not shown).

Figure 8:
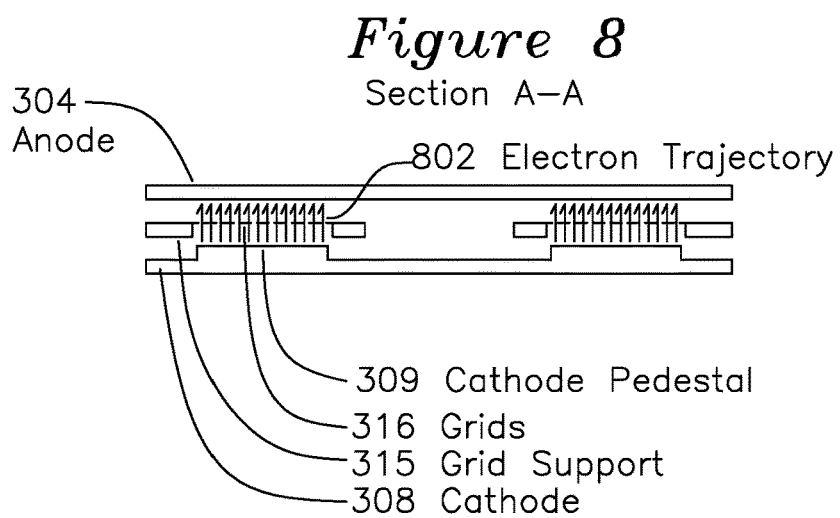
FIG. 8 shows a section view through FIG. 7 also showing electron trajectories for electron beams of the multi-beam triode of FIG. 3.
Figure 8A:
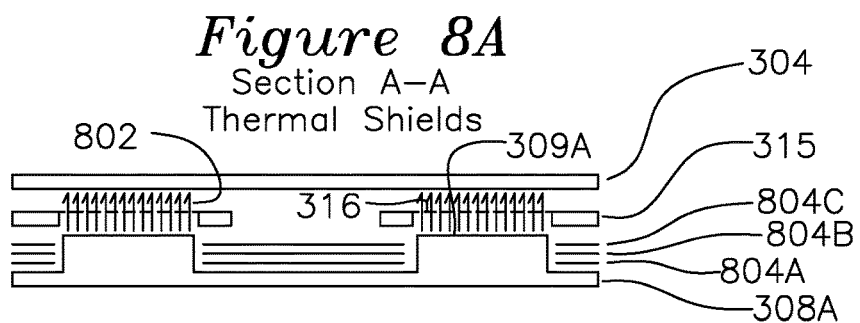
FIG. 8A shows a section view of an embodiment of FIG. 8 with thermal shields.

FIG. 8 shows a section A-A through FIG. 7, and shows the relationship between the cathode pedestals 309, cathode 308, grid support 315, control grids 316 in grid support apertures, and electron trajectory 802 to anode 304. FIG. 8A shows the previously described thermal barriers 804A, 804B, and 804C, which may be formed from thin sheets of refractory metal such as molybdenum with a thickness on the order of 0.002 inch thickness, where the thermal shields are formed with apertures to allow the passage of cathode 308A pedestals 309A. Anode 304 and grid support 315 (with corresponding grids 316) are unchanged from previously described embodiments. Any number of thermal barriers may be used, three are shown for exemplar purposes only.

The multiple beams generated by the triode will drive a common resonant cavity at the operating frequency. Typically, triodes are integrated with coaxial input and output cavities, which provides advantages with regard to size, tunability, and simplicity. FIG. 5 shows device 500 comprising a frequency-independent triode 320 coupled to a coaxial input cavity 310 and coaxial output cavity 522 operative at a particular frequency based on the respective coaxial cavity geometry and dimensions. The resonant cavities for coupling RF into and out of the triode may be tuned coaxial cavities (operative as transmission lines with shorted terminations, or as resonant radial cavities, each of which has prior art methodologies for coupling RF energy into and out of the cavity, and for tuning the cavity to a particular frequency. Anode connections 502, cathode connection 504, and grid connection 506 are also shown in FIG. 5.

Many other variations of the invention are also possible. For example, raising the oxide emission regions 309 on bosses machined into the nickel cathode substrate 308 of FIG. 4 would reduce the cathode-grid capacitance of the triode, alternatively, a screen grid would reduce the control grid to anode capacitance.

In one example process for design of a multi-beam triode, the process comprises the steps:

1. Determine the operating wavelength of the triode.
2. Determine the anode circuit output impedance. This is a function of the output cavity dimensions and the grid/anode contact surfaces. Typical values are 30-50 Ohms.
3. Use the output capacitance of the triode to calculate the reactance at the operating frequency. Typical values are 10-25 Ohms.
4. Use the general formula for coaxial lines to determine the length of the anode line:

$jX_c = jZ_0 \tan \theta$

5. Increment the anode length in multiples of half wavelengths to achieve a value which provides for a sufficient length to provide output coupling of RF power without interference from other structures.
6. Design the input line using the same procedure using appropriate values for the input capacitance and practical impedances.
7. Design the output tuning and coupling. For narrow operating ranges, capacitive elements can be added to the output cavity for tuning. Alternatively, a tuning plunger can be added to change the length of the line. Output coupling can be achieved using a capacitive probe or an inductive loop. The example RF output cavity shown in FIG. 6 incorporates a capacitive tuner 604 and a capacitive RF output coupler 606.
8. Design input tuning and coupling. A plunger in the input RF coaxial line is typically used to match to the input RF signal, as shown in FIG. 6.

The actual design will depend on the electrical parameters determined in the previous tasks, accordingly, it is possible to make first order assumptions for comparative purposes. The capacitances for an eight beam triode will be approximately eight times greater than a prior art 25 kW triode, then the triode dimensions for a 350 MHz source will be approximately 18 inch in axial length, and 16 inch in diameter, and weigh approximately 160 lbs, compared to the theoretical power in a conceptual multi-beam IOT with a magnetic field generator, which would be 4 feet in length, 28 inches in diameter, and weigh 1300 lbs. A commercially available klystron would be 28 inches in diameter, more than 14 feet in length, and weigh more than 3000 pounds. For the present invention, it is possible to trade off diameter for length; however, the example configuration described represents a reasonable device package. An input matching section, similar to that shown for FIG. 6 inner coaxial RF input, would add approximately 12 inches to the overall length, and cooling connections, output coupler, tuners, and other required components will slightly increase the outline dimensions. The multi-beam gridded triode in this example would weigh approximately 160 pounds, almost 1/10th of the weight of a theoretical IOT, roughly 1/20th the weight of the commercially available klystron, and be 1/3 of the length or diameter of the IOT, and 1/6 the length of an equivalent klystron. Using the same triode in a device with coaxial input and outputs for 650 MHz results in a smaller device weighing approximately 200 pounds.

The examples of the invention are set forth for understanding the invention, and are not intended to limit the invention to only the embodiments and examples shown. Dimensions "on the order of" are understood to be in the range of 0.1× smaller or 10× greater than the specified nominal value. Dimensions which are "approximate" are understood to be preferred to be in the range of ½ times to 2 times the specified nominal value. The control grids 316 (or optional screen grids) may be formed from any refractory metal, including niobium, molybdenum, tantalum, tungsten, or rhenium, preferably tungsten mesh or molybdenum in sheet form. Because the cathode is operative at temperatures below 800° C., it may be formed from a metal such as nickel. The anode 304 may be formed from a metal with high thermal conductivity such as copper.

I claim:

1. A gridded electron tube comprising:
    a plurality of electrically common thermionic cathodes, each said cathode having an emission surface and emitting electrons travelling in trajectories perpendicular to the emission surface;
    a plurality of control grids supported by a grid support having apertures for said control grids, one said control grid placed in an associated grid support aperture for each associated thermionic cathode;
    an anode electrode on an opposite surface of said control grid from said cathodes;
    an RF input source coupled to the control grids;
    an RF output coupled to the anode electrode.

2. The gridded electron tube of claim 1 where each said cathode is formed by applying a patterned oxide to a planar surface of a cathode substrate.

3. The gridded electron tube of claim 2 where said patterned oxide is an oxide of at least one of: beryllium (Be), magnesium (Mg), calcium (Ca), strontium (Sr), barium (Ba), or radium (Ra).

4. The gridded electron tube of claim 1 where each said cathode is formed by a raised pedestal having an oxide applied to said raised pedestal.

5. The gridded electron tube of claim 4 where said patterned oxide is an oxide of at least one of: beryllium (Be), magnesium (Mg), calcium (Ca), strontium (Sr), barium (Ba), or radium (Ra).

6. The gridded electron tube of claim 4 where the regions surrounding said raised pedestal include thermal barriers which reduce radiant heating of the grid support.

7. The gridded electron tube of claim 1 where any region of said grid support which is adjacent to a raised cathode pedestal has an aperture with a control grid present in the grid support, and the central region of said grid support includes an aperture without a control grid.

8. The gridded electron tube of claim 1 where the transparency of said control grid in the range of 8% to 100%.

9. The gridded electron tube of claim 1 where the number of said cathode emission surfaces and the number of control grids is in the range from 3 to 15.

10. The gridded electron tube of claim 1 where said control grid support has regions adjacent to said control grids which have sufficient width to maintain the highest temperature of the control grid to less than 500° C.

11. The gridded electron tube of claim 1 where a coaxial input cavity is formed between the grid support and the plurality of electrically common thermionic cathodes;

a coaxial output cavity formed between the grid support and the anode electrode, the coaxial output cavity enclosing at least part of the extent of the coaxial input cavity.

12. A triode amplifier comprising:

a thermionic cathode having a plurality of electron emission surfaces and emitting electrons with a substantially uniform electron beam trajectory;

a multi-beam grid support having a plurality of apertures, each aperture substantially aligned over each of said plurality of electron emission surfaces, each said aperture of said grid support having an associated control grid;

an anode positioned on the opposite surface of said grid support from said thermionic cathode;

a first coaxial cavity for input radio frequency (RF) energy, said first coaxial cavity coupled to said grid support and to each of said control grids;

a second coaxial cavity coupled to said anode, said coaxial cavity including an output port for RF amplified by said triode amplifier.

13. The triode amplifier of claim 12 where the number of electron beams and grids is in the range from 3 to 15.

14. The triode amplifier of claim 12 where each said cathode is formed by applying a patterned oxide to a planar surface of a cathode substrate.

15. The triode amplifier of claim 14 where said patterned oxide is an oxide of at least one of: beryllium (Be), magnesium (Mg), calcium (Ca), strontium (Sr), barium (Ba), or radium (Ra).

16. The triode amplifier of claim 12 where each said cathode is formed by a raised pedestal having an oxide applied to said raised pedestal.

17. A gridded electron tube comprising:

a plurality of electrically common thermionic cathodes, each said cathode having an emission surface and emitting electrons with trajectories substantially perpendicular to the cathode;

a plurality of control grids supported by a grid support having apertures for said control grids, one said control grid placed in an associated grid support aperture for each associated thermionic cathode;

an anode electrode on an opposite surface of said control grid from said cathodes;

at least one screen grid positioned between said control grid support and said anode and coupled to a terminal;

the control grids having an electrical connection for an RF input source;

the at least one screen grid having an electrical connection;

the anode electrode having an electrical connection for an RF output.

18. The gridded electron tube of claim 17 where the transparency of at least one of said control grid or said at least one screen grid is in the range of 8% to 100%.

19. The gridded electron tube of claim 17 where said at least one screen grid includes a screen grid support with apertures which are coincident with the apertures in said control grid support.

20. The gridded electron tube of claim 17 where a coaxial input cavity is formed between the control grid electrical connection and the plurality of thermionic cathodes;

a coaxial output cavity encloses at least part of the extent of the coaxial input cavity.

* * * * *